United States Patent
He et al.

(10) Patent No.: US 8,249,386 B2
(45) Date of Patent: Aug. 21, 2012

(54) VIDEO BANDWIDTH RESOLUTION IN DFT-BASED SPECTRUM ANALYSIS

(75) Inventors: Yi He, Portland, OR (US); Marcus K. Dasilva, Portland, OR (US); Kathryn A. Engholm, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 1181 days.

(21) Appl. No.: 12/058,546

(22) Filed: Mar. 28, 2008

(65) Prior Publication Data

US 2009/0245686 A1   Oct. 1, 2009

(51) Int. Cl.
*G06K 9/36* (2006.01)

(52) U.S. Cl. ........ 382/280; 382/250; 382/294; 382/272; 348/384.1

(58) Field of Classification Search .................. 382/280, 382/260, 264, 250, 294, 272; 348/384.1
See application file for complete search history.

(56) References Cited

U.S. PATENT DOCUMENTS

| | | | | |
|---|---|---|---|---|
| 4,093,989 A * | 6/1978 | Flink et al. | ................. | 324/76.28 |
| 4,101,891 A * | 7/1978 | Fletcher et al. | ............. | 342/25 A |
| 4,509,048 A * | 4/1985 | Jain | ............................. | 342/25 R |
| 5,260,783 A * | 11/1993 | Dixit | ........................ | 375/240.13 |
| 5,377,014 A * | 12/1994 | Knauer et al. | ................. | 386/346 |
| 5,576,978 A * | 11/1996 | Kitayoshi | ........................ | 702/77 |
| 6,072,419 A * | 6/2000 | Normant | ........................ | 342/25 F |
| 6,229,998 B1 * | 5/2001 | Hamdy et al. | ............. | 455/226.1 |
| 6,370,484 B1 * | 4/2002 | Gorin et al. | ...................... | 702/66 |
| 6,377,617 B1 * | 4/2002 | Nara | .............................. | 375/224 |
| 6,448,923 B1 * | 9/2002 | Zrnic et al. | ................... | 342/26 R |
| 6,876,953 B1 * | 4/2005 | Fisher | ........................... | 702/189 |
| 6,898,235 B1 | 5/2005 | Carlin et al. | | |
| 7,099,417 B2 * | 8/2006 | Siegel et al. | ................... | 375/350 |
| 7,924,211 B2 * | 4/2011 | Bosser et al. | ................ | 342/26 R |
| 2002/0001350 A1 * | 1/2002 | Wu et al. | ................... | 375/240.26 |
| 2003/0123548 A1 * | 7/2003 | Kajita | ........................ | 375/240.13 |
| 2006/0291631 A1 * | 12/2006 | Hosoi et al. | ................ | 379/88.07 |
| 2008/0024390 A1 * | 1/2008 | Baker et al. | .................... | 345/1.3 |
| 2008/0270440 A1 | 10/2008 | He et al. | | |

FOREIGN PATENT DOCUMENTS

WO   20070056652 A2   5/2007
WO   WO 2007056652 A2 *   5/2007

* cited by examiner

*Primary Examiner* — Jayesh A Patel

(74) *Attorney, Agent, or Firm* — Christopher S. Tuttle; Michael A. Nelson

(57) ABSTRACT

A method and apparatus for improved video bandwidth resolution in DFT-based spectrum analysis is disclosed. A first embodiment comprises an emulation of a continuous range of video bandwidths in DFT-based spectrum analysis using overlapping resolution bandwidth frames. A second embodiment utilizes frame weighting to reduce the standard deviation in the spectrum of noise signal to emulate a corresponding standard deviation of a specified video bandwidth.

13 Claims, 4 Drawing Sheets

VIDEO BANDWIDTH RESOLUTION IN DFT-BASED SPECTRUM ANALYSIS

BACKGROUND

The present invention relates to radio frequency or microwave receivers, and more particularly to a method of improved video bandwidth resolution in Discrete Fourier Transform (DFT) based spectrum analysis.

In traditional swept spectrum analyzers, video bandwidth (VBW) filtering is used to reduce noise effects for displayed signal amplitudes. For example, a video filter is typically implemented as a low-pass filter placed after a log envelope detector and can be used to detect signals close to a certain noise level.

DFT based spectrum analyzers have emerged as a compelling measurement tool in relation to swept spectrum analyzers due to their capability of vector analysis, the combination of fast measurement times with wide spans and low resolution bandwidth (RBW), and real-time capabilities such as Digital Phosphor Spectrum Analysis (DPSA). However, architecture differences have not allowed traditional VBW filtering methods to be used on DFT-based spectrum analyzers.

Although DFT-based spectrum analyzers can emulate the effect of video filtering using trace averaging, trace averaging uses a discrete number of spectrum traces and therefore results in a coarse resolution in the available VBW values. Further, many standards such as the Worldwide interoperability for Microwave access (WiMax), the Global System for Mobile communications (GSM), and also government emission tests specify requirements based on a specific VBW. What is desired is a method of improved video bandwidth resolution in DFT-based spectrum analysis.

SUMMARY

Video filtering can be emulated on discrete Fourier transform (DFT) based spectrum analyzers using a modified trace averaging approach. Accordingly, various embodiments for improved video bandwidth resolution in DFT-based spectrum analysis are described below in the Detailed Description. For example, one embodiment comprises an emulation of a continuous range of video bandwidths using overlapping resolution bandwidth frames. A second embodiment utilizes frame weighting to produce the desired standard deviation to emulate a corresponding standard deviation of a specified video bandwidth.

This Summary is provided to introduce concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
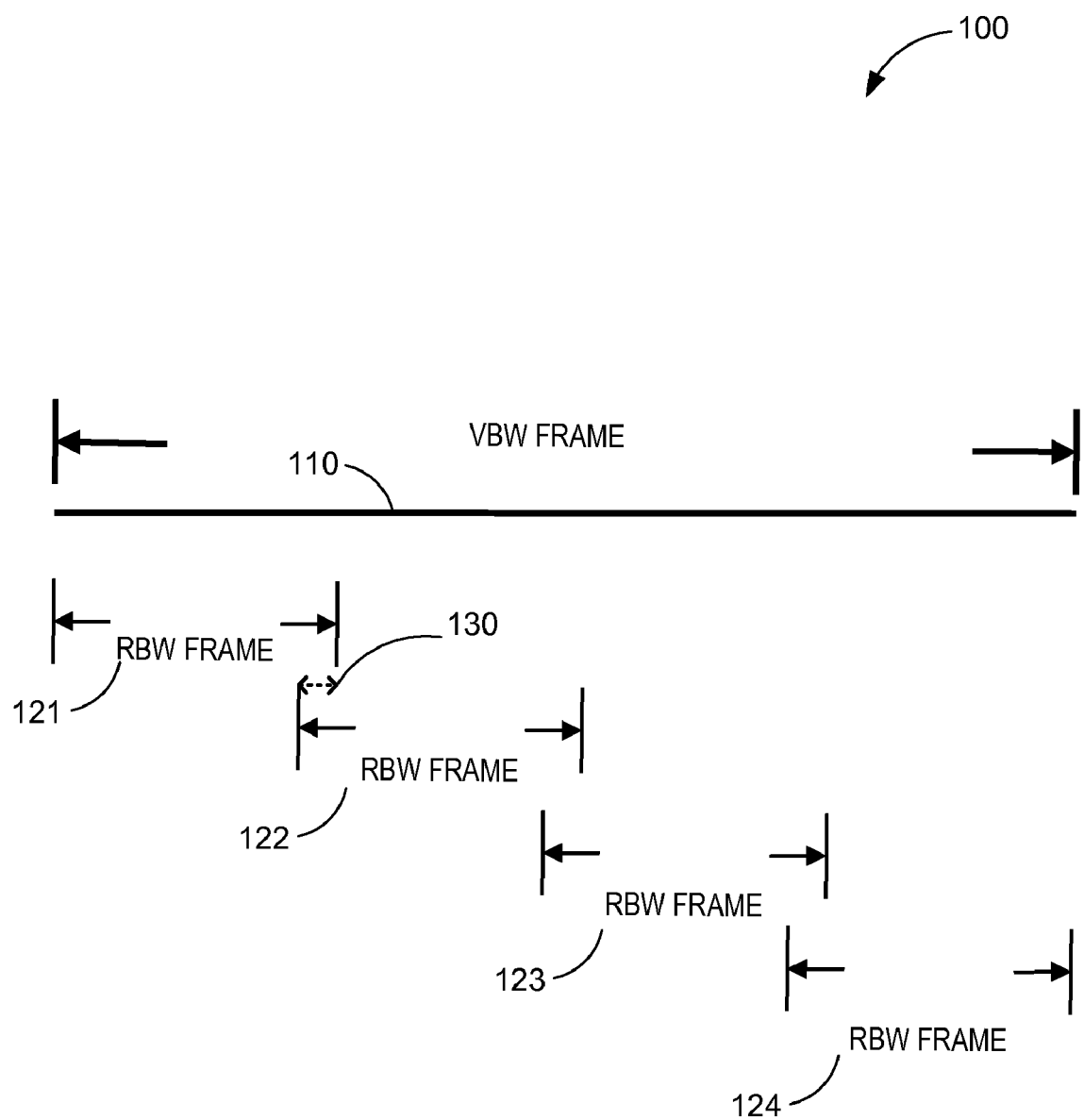
FIG. 1 shows an example sub-framing of a signal acquisition using overlapping resolution bandwidth frames.

FIG. 1 shows an embodiment 100 including a video bandwidth frame 110 including a signal acquisition using overlapping 130 resolution bandwidth frames 121-124. In order to provide a smooth spectrum display of an analyzed signal in DFT spectrum analysis, spectrum traces have been averaged over an integer number of traces. Trace averaging functions as a low pass filter of spectrum traces to smooth a video representation of spectral content in a similar effect to a video bandwidth filter in a traditional swept spectrum analyzer. The embodiments described below allow trace averaging over a non-integer number of averages, in turn providing video bandwidth emulation with a user-specified VBW value.

In some embodiments, a standard deviation ($\sigma$) is used to characterize how smooth a spectrum trace is. As an example, for N independent spectrum measurements, a standard deviation of an averaged spectrum trace is $\sigma = k_1/\sqrt{N}$, where $k_1$ is a constant for Gaussian-distributed random noise and about 4.4 dB if power averaging is used. On a swept spectrum analyzer and with certain operating conditions, a standard deviation can approximately be related to the ratio of VBW to RBW by the equation $\sigma = k_2 * \sqrt{(VBW/RBW)}$. In this example, $k_2$ is a constant at around 9.3 dB. Other $k_1$ and $k_2$ constants may be used to approximate a standard deviation. In addition, a standard deviation on a swept spectrum analyzer can be related to VBW/RBW by other forms of empirical equations. In the present example, the relationship between N independent spectrum measurements and the VBW/RBW ratio can therefore be expressed as $VBW/RBW = (k_1^2)/(N*(k_2^2))$.

Referring in particular to FIG. 1, a first embodiment 100 acquires a contiguous block of time data in VBW frame 110. The number of samples in VBW frame 110 produces statistically a similar smoothing effect as VBW in a swept spectrum analyzer. Then, the VBW frame 110 can then be divided into multiple transform frames, or sub-frames, and then each sub-frame can undergo a time-to-frequency domain transform. In this manner, all spectrum traces can be combined into a single spectrum trace of a desired VBW and RBW.

On DFT-based spectrum analyzers, the transform frame length, or "RBW frame", is determined by the ratio $k_3$/RBW, where $k_3$ is a window-related coefficient. For a sampling frequency fs, the number of samples in an RBW frame can be determined according to the equation $nr = round(k_3 * fs/RBW)$, where round( ) rounds to the nearest integer. In some embodiments, a windowing function may be applied prior to the DFT to reduce spectrum leakage caused by the finite length transform. A more detailed example of the first embodiment based on overlapped RBW frames is described in the following paragraphs.

For a given VBW, RBW and sampling frequency fs, an amount of samples to be acquired can be determined according to the equation $nv = round(nr \times (K_1^2/K_2^2) \times (RBW/VBW))$, where nr is the number of samples in the RBW frame. In this equation, the number of samples in the VBW frame is rounded to the nearest integer. Note, nr may be considerably larger than 1. For example, in an auto configuration mode on a typical spectrum analyzer, nr is typically around 200 samples. In some embodiments, the number of samples may be determined by an empirical relationship to the ratio (RBW/VBW), as could be determined by one of skill in the art. In this way, available VBW resolution can be effectively increased by a factor of approximately 200.

After the number of samples to be acquired is calculated, the number of RBW frames 121-124 needed to cover the VBW frame 110 is determined. For example, an embodiment may determine the ratio between the number of samples nv in the VBW frame 110, and the number of samples nr in an RBW frame, and then round upward to the closest integer number ns. This relationship can be expressed by the equation ns=ceil (nv/nr), where ceil( ) rounds up to the closest integer number.

Next, a DFT transform can be performed on the first RBW frame data. In some embodiments, a fast Fourier transform (FFT) or Chirp-Z Transform (CZT) can be used to provide better computation efficiency.

Then, a DFT transform can be performed on the subsequent RBW frame at a specified offset 130 from the first RBW frame. A recursive algorithm that can be used to determine the offsets of RBW frames is discussed below in reference to FIG. 2. In the example embodiment 100 illustrated in FIG. 1, consecutive RBW sub-frames partially overlap and are therefore not completely statistically independent.

Due to this overlap, the reduction in standard deviation of the noise from two dependent measurements is therefore less than $1/\sqrt{2}$. Therefore, RBW frame overlap can be controlled to provide a better approximation of a specified VBW. For each remaining RBW frame, a DFT transform can be performed at a specified offset until all RBW frames have been transformed to the frequency domain. According to this process, a composite spectrum trace can be calculated by averaging spectrum results over all the RBW frames.

Figure 2:
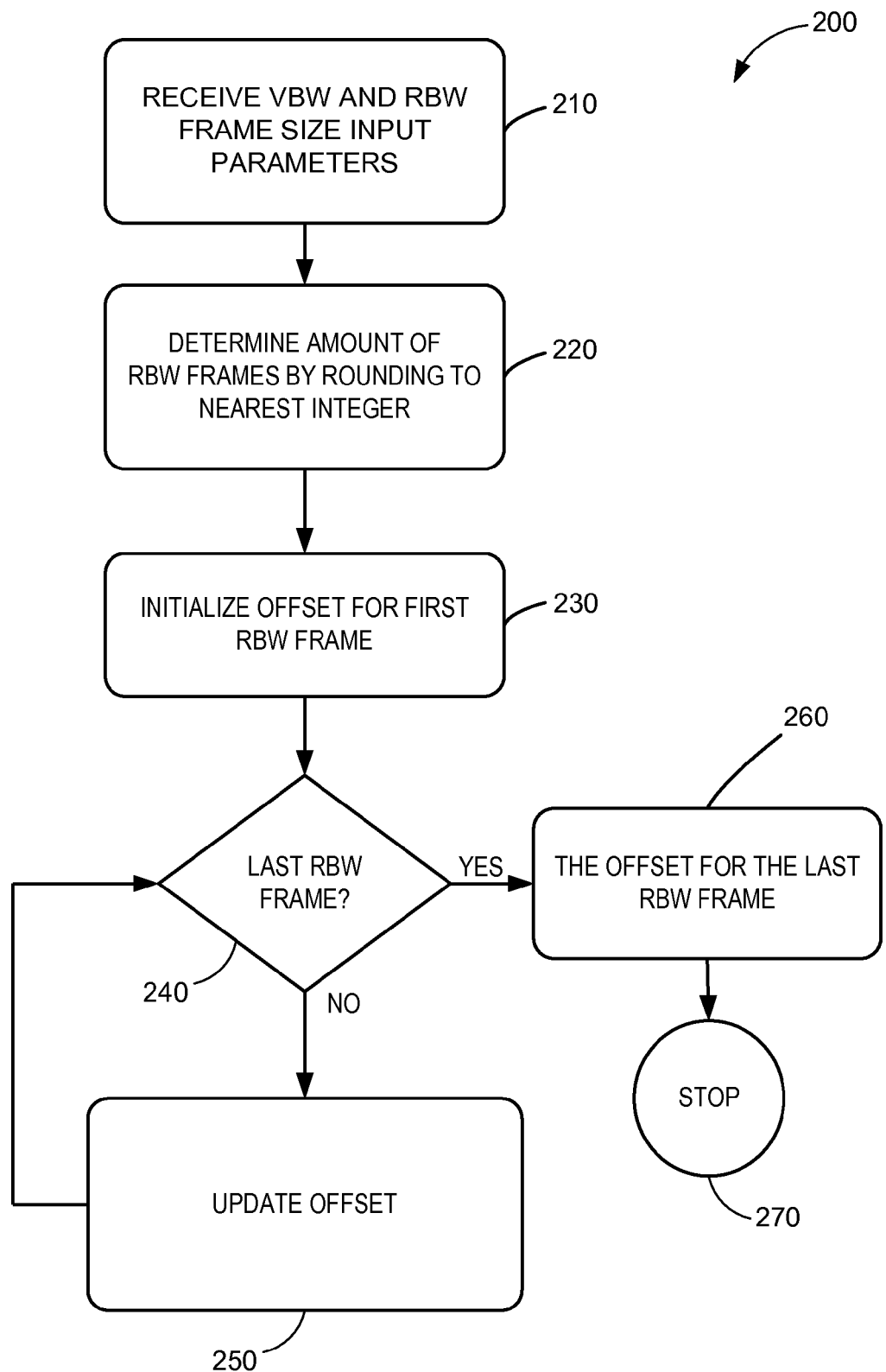
FIG. 2 is a flowchart illustrating a recursive resolution bandwidth frame offset algorithm for the example shown in FIG. 1.

FIG. 2 is a flowchart illustrating a resolution bandwidth frame offset algorithm 200 for the example shown in FIG. 1. In general, offset algorithm provides an offset for each RBW frame in order to overlap a number of RBW frames to provide a specified VBW. In more detail, block 210 receives a specified VBW frame size and RBW frame size. For example, the VBW frame size may be nv and the RBW frame size can be nr as discussed in reference to FIG. 1. Next, in block 220 an amount of RBW frames is determined by performing a ceiling function on the ratio nv/nr, in turn rounding the ratio nv/nr to the nearest integer ns. The offset for a given RBW frame is then initialized in block 230. For the first RBW frame, the offset variable equals 1, the remaining RBW frames n1 are initialized to ns, and the remaining VBW frame samples n2 is initialized to nv.

Next, in decision block 240, offset algorithm 200 queries if the current offset calculation is for the last RBW frame. If not, then the offset algorithm updates the offset in block 250 and loops to decision block 240. In the present detailed example, the update offset in block 250 may be performed by setting the offset variable equal to the current offset variable value plus nr, and subtracting the result of rounding $((n_1 *nr-n_2)/(n_1-1))$. In this iteration, the remaining RBW frame count can be decremented according to $n_1=n_1-1$, and the remaining VBW frame number can be recalculated as $n_2$=nv−offset+1. When the offset algorithm reaches the last RBW frame, the offset variable equals nv−nr+1 and the algorithm has traversed the entire VBW frame.

Figure 3:
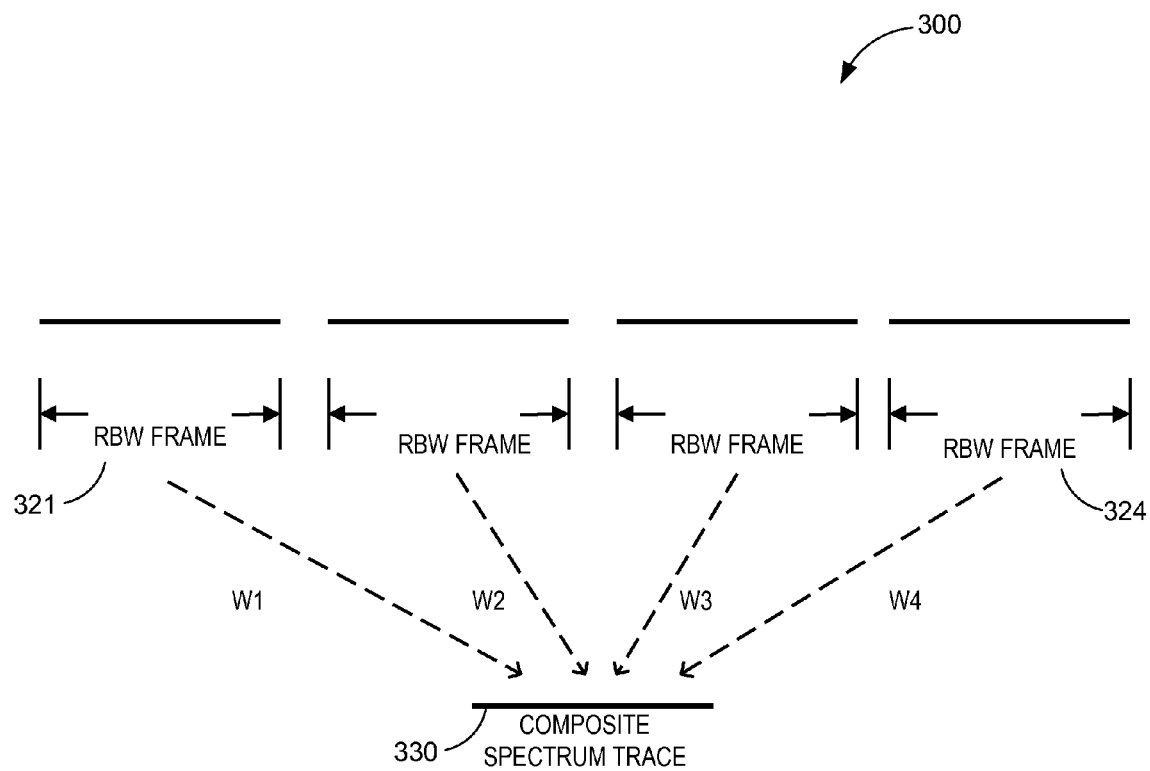
FIG. 3 shows an example video bandwidth emulation based on resolution bandwidth frame weighting.

FIG. 3 shows a second embodiment 300 of an example video bandwidth emulation based on resolution bandwidth frame weighting. Embodiment 300 includes RBW frames 421 and 424, as well as intermediate RBW frames.

In the second embodiment 300, integer RBW frames 321, 324, etc., are captured and weights W1, W2, W3, and W4 are assigned to each RBW frame in order to achieve statistical properties equivalent to a specified VBW. In embodiments using frame weighting, the RBW frames are not necessary contiguous and can be separated in time. Second embodiment 300 will now be discussed in more detail with reference to FIG. 4.

Figure 4:
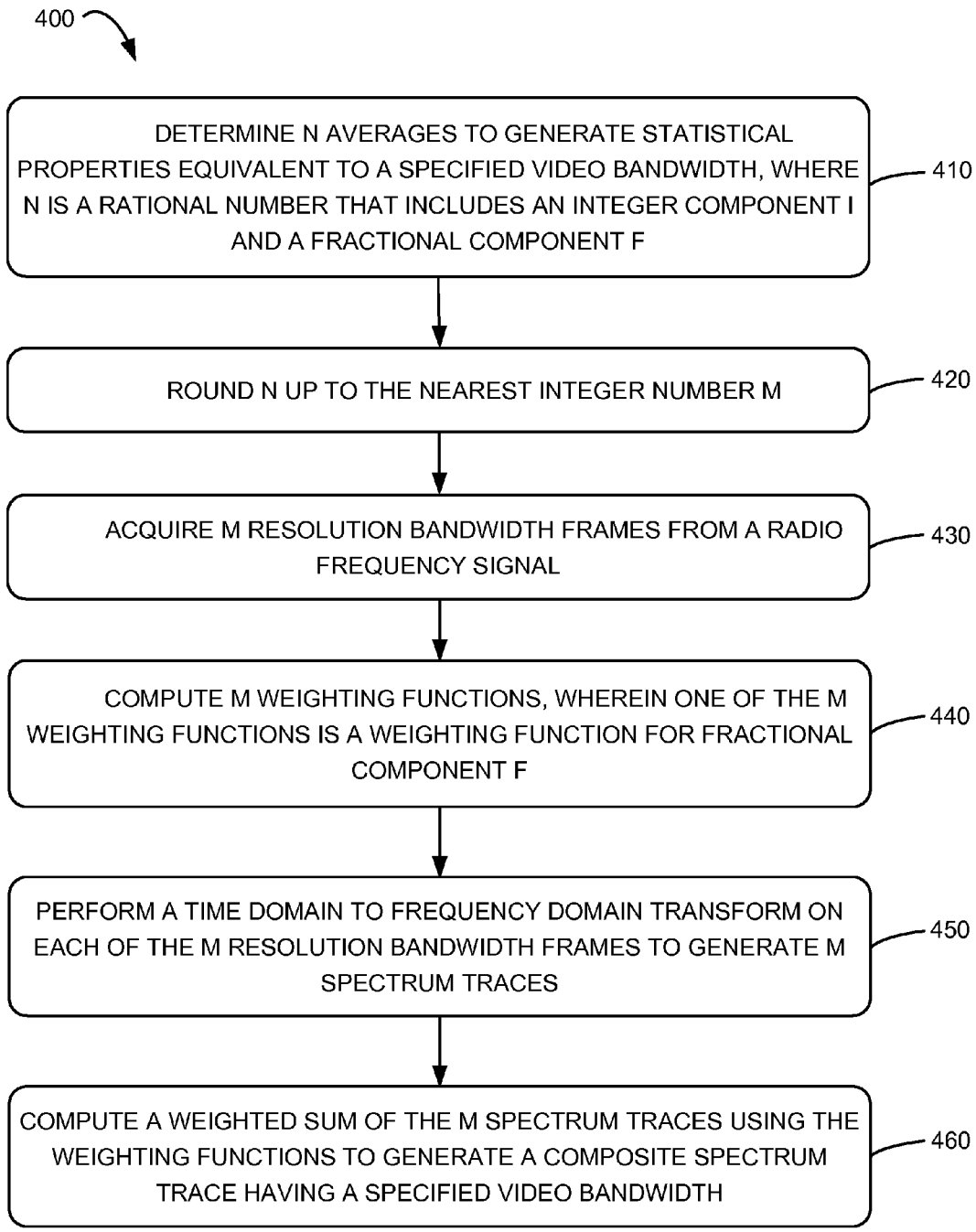
FIG. 4 is a flow diagram illustrating a method for video bandwidth emulation based on resolution bandwidth frame weighting.

FIG. 4 is a flow diagram illustrating a method 400 for video bandwidth emulation based on resolution bandwidth frame weighting. First, as indicated in block 410, an amount of averages is determined to generate statistical properties in a sampled radio frequency signal that are equivalent to a specified VBW. In the current example, this amount of averages is designated "N", wherein N is a rational number including an integer component "I" and a fractional component "F". For example, the number of averages for an equivalent smoothing may be determined from the equation $N=((k_1\hat{}2)/(k_2\hat{}2))/$ (VBW/RBW) discussed above. Then, the determined number of averages N is rounded up to the nearest integer number "M", as illustrated in block 420. Next, method 400 acquires M number of RBW frames from a radio frequency signal, as indicated at 430.

In block 440, M weighting functions are computed, wherein one of the weighting functions is a fractional weighting function corresponding to the fractional component F. In this manner of averaging, the weighting functions for each of the M frames are calculated so that similar reduction in standard deviation is achieved as from a specified VBW. Integer weighting functions I are calculated using the formula $$\frac{1}{I+A},$$

and the fractional component F is calculated using the formula $$\frac{A}{I+A}.$$

Wherein A is calculated according to the equation, $$A = I \frac{\sqrt{1-F+\frac{F}{I}-\frac{F^2}{I}}}{N-1}$$

Then, the method 400 performs a time domain to frequency domain transform on each of the M resolution bandwidth frames to generate M spectrum traces, in block 450. Example embodiments may use a discrete Fourier transform (DFT), a fast Fourier transform (FFT) and a chirp-Z transform (CZT). However, other embodiments are not so limited and may use any suitable transform from the time domain to the frequency domain.

Then, a weighted sum of the M spectrum traces is computed using the weighting functions according to the formula $$S = \sum_{i=1}^{I} a_i X_i + a_M X_M,$$

and a composite spectrum trace is generated having a specified video bandwidth, as illustrated in block 460.

The following paragraph provide a derivation of a VBW weighting function for using averaging as discussed with reference to FIG. 3 and FIG. 4. Whole number averages may be calculated as follows. Consider N independent data records of a random process X, with a mean $\overline{X}$, and a standard deviation $\sigma_X$. Then, let each data record be denoted by $X_1, X_2, X_3, \ldots, X_N$. By averaging N data records we have, $$X_{AVE} = \frac{1}{N} \sum_{i=1}^{N} X_i = \overline{X}$$

$$\sigma_{AVE} = \frac{1}{N} \sqrt{\sum_{i=1}^{N} \sigma_X^2} = \frac{\sigma_X}{\sqrt{N}}$$

This equation allows for averaging an integer number of times. However, sometimes it is desirable to obtain a reduction in a standard deviation wherein the reduction is between an integer number of averages. In this case, a fractional number of averages may be calculated.

Consider the averaging process shown above where N can be a fractional number N=I+F. By providing unity weighting for I averages and a fractional weight for the remaining average in relation to F, a weighted average with equivalent smoothing of a fractional number of averages can be emulated.

$$X_{AVE} = \frac{1}{I+A} \left( \sum_{i=1}^{I} X_i + AX_{i+1} \right) = \overline{X}$$

$$\sigma_{AVE} = \frac{1}{I+A} \sqrt{\sum_{i=1}^{I} \sigma_X^2 + A^2 \sigma_X^2} = \frac{\sigma_X}{\sqrt{I+F}}$$

Next, by summing to I and factoring the $\sigma_X^2$ out from the square root in the $\sigma_{AVE}$ term, we have, $$\sigma_{AVE} = \frac{\sigma_X}{I+A} \sqrt{I+A^2} = \frac{\sigma_X}{\sqrt{I+F}}$$

Since $\sigma_X$ is a common numerator on both side of the equation, we can factor it out to generate, $$\frac{\sqrt{I+A^2}}{I+A} = \frac{1}{\sqrt{I+F}}$$

Then, we solve for I+F by exchanging $$\frac{\sqrt{I+A^2}}{I+A}$$

for the denominator $\sqrt{I+F}$, and squaring both sides to generate.

$$I+F = \frac{I^2 + 2IA + A^2}{I+A^2}$$

Whereby, $$I^2 + IF + IA^2 + FA^2 = I^2 + 2IA + A^2$$

Accordingly, we can solve for A as may be used in the weighting functions, whereby, $$IF + IA^2 + FA^2 = 2IA + A^2$$

By placing all the variables on one side of the equation and solving for 0 we get, $$A^2(1-F-I) + 2IA - IF = 0$$

Then we can solve for A accordingly, $$A = \frac{-2I \pm \sqrt{4I^2 + 4(1-F-I)IF}}{2(1-F-I)}$$

Then, we factor 2 out of the numerator and denominator, and I out of the numerator to generate, $$A = \frac{I \left[ 1 \pm \sqrt{1 + \frac{(1-F-I)}{I} F} \right]}{(I+F-1)}$$

Which simplifies to the weighting factor A, whereby, $$A = \frac{I \left[ 1 \pm \sqrt{1 - F + \frac{F}{I} - \frac{F^2}{I}} \right]}{(I+F-1)}$$

It will be appreciated that the embodiments described herein may be implemented, for example, via computer-executable instructions or code, such as programs, stored on a computer-readable storage medium and executed by n instrument receiver or other suitable computing device. In addition, the embodiments described herein may be implemented on hardware such as Field Programming Gate Array (FPGA), an Application Specific Integration Circuit (ASIC), and other suitable hardware architectures.

Generally, programs include routines, objects, components, data structures, and the like that perform particular tasks or implement particular abstract data types. As used herein, the term "program" may connote a single program or multiple programs acting in concert, and may be used to denote applications, services, or any other type or class of program. Likewise, the terms "computer" and "computing device" as used herein include any device that electronically executes one or more programs, including, but not limited to a numerical spectrum analyzer, or any other suitable RF signaling devices.

It will further be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of any of the above-described processes is not necessarily required to achieve the features and/or results of the embodiments described herein, but is provided for ease of illustration and description. The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A method of emulating a specified video bandwidth (VBW) in a spectrum analyzer using overlapping resolution bandwidth (RBW) frames, the method comprising the steps of:
   acquiring a contiguous block of time data from a radio frequency signal to create a VBW frame, the VBW frame having a number of samples based on the specified VBW, a specified RBW, and a specified sampling frequency;
   dividing the VBW frame into a number of overlapping RBW frames, the number of overlapping RBW frames being based on the number of samples in the VBW frame and a number of samples in each RBW frame, and the number of samples in each RBW frame being based on the specified RBW, the sampling frequency, and a window-related coefficient;
   performing a time domain to frequency domain transform on each RBW frame to generate a spectrum trace for each RBW frame; and
   averaging the spectrum traces for each of the RBW frames to generate a composite spectrum trace that emulates the specified VBW.

2. The method of claim 1, wherein the spectrum traces are averaged using power averaging, logarithm averaging, or voltage scale averaging.

3. The method of claim 1, wherein the time domain to frequency domain transform is one of a discrete Fourier transform, a fast Fourier transform and a chirp-Z transform.

4. The method of claim 1, wherein the number of samples is calculated according to the formula (nr*(k1^2/k2^2)*(RBW/VBW)), wherein k1 is a constant for Gaussian-distributed random noise, k2 is approximately 9.3 dB, nr is the number of samples in each RBW frame, and the resulting value is rounded up to the nearest integer.

5. The method of claim 1, wherein the number of samples is empirically related to a ratio (RBW/VBW).

6. A method of emulating a specified video bandwidth (VBW) in a spectrum analyzer using weighted resolution bandwidth (RBW) frames, the method comprising the steps of:
   determining a number N of averages that generates statistical properties equivalent to the specified VBW, where N is a rational number including an integer component I and a fractional component F;
   rounding N up to a nearest integer number M;
   acquiring M RBW frames from a radio frequency signal;
   computing M weighting functions, wherein one of the M weighting functions is a weighting function for the fractional component F;
   performing a time domain to frequency domain transform on each of the M RBW frames to generate M spectrum traces; and
   computing a weighted sum of the M spectrum traces using the weighting functions to generate a composite spectrum trace having a specified VBW.

7. The method of claim 6, wherein N is determined using a proportional multiple of the specified VBW divided by the RBW.

8. The method of claim 7, wherein the proportional multiple is determined using a square of a first constant related to Gaussian-distributed random noise divided by the square of a second constant.

9. The method of claim 6, wherein the time domain to frequency domain transform is one of a discrete Fourier transform, a fast Fourier transform and a chirp-Z transform.

10. The method of claim 6, wherein the weighting function for traces corresponding to integer component RBW frames is $$\frac{1}{I+A}$$

and the weighting function for the trace corresponding to the fractional component RBW frame is calculated using the formula $$\frac{A}{I+A},$$

wherein A is determined by the equation $$A = I \frac{\sqrt{1 - F + \frac{F}{I} - \frac{F^2}{I}}}{N-1}.$$

11. The method of claim 6, wherein computing a weighting function for each of the M RBW frames includes generating a similar reduction in standard deviation between the M RBW frames as would be achieved using a specified VBW.

12. A computer readable storage device comprising instructions executable by a computing device, the instructions being executable to perform the method of any one of claims 1-3 or 4-5.

13. A computer readable storage device comprising instructions executable by a computing device, the instructions being executable to perform the method of any one of claims 6-11.

* * * * *